United States Patent [19]

Wenke

[11] Patent Number: 5,630,272
[45] Date of Patent: May 20, 1997

[54] METHOD OF FORMING CONTACTS THROUGH BORES IN MULTI-LAYER CIRCUIT BOARDS

[75] Inventor: Stephan Wenke, Springe, Germany

[73] Assignee: LPKF CAD/CAM Systeme GmbH, Garbsen, Germany

[21] Appl. No.: 551,950

[22] Filed: Nov. 2, 1995

[30] Foreign Application Priority Data

Nov. 2, 1994 [DE] Germany .................. 44 39 108.0

[51] Int. Cl.$^6$ ........................................... H01K 3/10
[52] U.S. Cl. ................. 29/852; 29/848; 174/266; 427/97
[58] Field of Search ............... 29/852, 848; 427/97; 174/266

[56] References Cited

U.S. PATENT DOCUMENTS

| 5,145,691 | 9/1992 | Kawakami et al. |
| 5,274,916 | 1/1994 | Kawabata et al. ............ 29/852 X |

FOREIGN PATENT DOCUMENTS

| 1-59892 | 3/1989 | Japan ................. 29/852 |
| 3-117902 | 5/1991 | Japan . |
| 4-170090 | 6/1992 | Japan ................. 29/852 |
| 5-21953 | 1/1993 | Japan ................. 29/852 |

OTHER PUBLICATIONS

Abstract of Published German Patent Application No. DE 3,509,626.
Abstract of Published European Patent Application No. EP 194,247.

*Primary Examiner*—Carl J. Arbes
*Attorney, Agent, or Firm*—Evenson, McKeown, Edwards & Lenahan P.L.L.C.

[57] ABSTRACT

A method and apparatus for creating through-connections in holes (5) in multi-layer printed circuit boards (2), in which the circuit board (2) is laid on a supporting frame (3) which leaves the area beneath the holes (5) free, and conductive paste (10) is injected by a dispensing apparatus (8, 9) into the holes (5) in the circuit board (2) with the formation of marginal overlaps (12), such that a protruding, outwardly spreading plug (11) of conductive paste is formed. In accordance with the method, a cartridge needle (8) of the dispensing apparatus (8, 9) is placed against the circuit board (2) at the location of each hole (5) that is to be provided with a through-connection, and solderable conductive paste (10) is dispensed into the hole (5), after which the cartridge needle (8) is removed. A vacuum probe (9) of the dispensing apparatus (8, 9) then is placed against the circuit board (2) at the location of the hole (5), and the conductive paste (10) is partially sucked up, such that the conductive paste (10) forms contacting marginal overlaps (12, 13) around each hole (5) on both sides of the circuit board (2) and a continuous layer of conductive paste (10) remains on inside walls of the holes (5) leaving the holes with a defined minimum hole diameter.

5 Claims, 3 Drawing Sheets

5,630,272

METHOD OF FORMING CONTACTS THROUGH BORES IN MULTI-LAYER CIRCUIT BOARDS

BACKGROUND OF THE INVENTION

The invention relates to a method for creating through-connections in holes in multi-layer printed circuit boards wherein the circuit board is placed on a supporting frame which leaves the area beneath the holes free, and conductive paste is injected into the holes in the board by a dispensing means with the formation of overlaps, such that a protruding, outwardly spreading plug is formed on the back of the holes.

Published German Patent Application No. DE 3,509,626, relating to making through-connections in printed circuit boards, discloses the application of conductive paste to the holes in the circuit boards by means of a screen printing process, then drawing the conductive paste partially into the holes by applying a vacuum beneath the board while preventing the conductive paste from reaching the bottom of the boards. Then the circuit boards must be laid in the apparatus with their underside up, and the described procedure of introducing conductive paste into the holes in the boards is repeated. A through-connection is thus created, but it is disadvantageous that the printed circuit board always must be placed in the apparatus a second time, and that a spot of conductive paste of varying thickness, but comparatively very thick overall, is created in the area of the holes and in the area of the margins thereof. Furthermore, the diameter of the holes is not precisely defined after the connection is completed.

Published European Patent Application No. EP 194,247 proposes that through-connections be made in circuit boards by applying conductive paste by means of a screen printing process with the formation of marginal overlaps and then drawing the conductive paste into the bores by means of a vacuum so that the conductive paste exits from the back side. Subsequently, the conductive paste is partially removed by compressed air with the formation of marginal overlaps on the back, while conductive paste also remains on the walls of the holes. This method, however, requires a complex printing machine. Also, a template as well as a matching bottom support must be prepared. Consequently, this process is economical only for large scale production. U.S. Pat. No. 5,145,691 also discloses filling the holes of printed circuit boards with conductive paste by means of a dispensing device in order to make through connections. The conductive paste then remains in the hole and fills it up completely. Additionally, it is necessary in this case to apply a mask over the circuit board.

SUMMARY OF THE INVENTION

The object of the invention is to make it possible to create through-connections, in a very flexible manner, in double-sided printed circuit boards, in prototypes and small scale production, with direct evaluation of electronically captured control data, in which precisely defined, thin marginal overlaps are created at both ends of the holes, and at the same time conductive paste is deposited in thin coats on the walls of the holes, resulting in the bores having an established minimum hole diameter which permits electronic components to be inserted and soldered in place.

The objects of the invention have been achieved in accordance with the invention by providing a method for creating through-connections in holes through multi-layer printed circuit boards comprising the steps of placing a circuit board having through holes which are to be provided with a through-connection on a supporting frame which leaves free areas beneath the holes; placing a cartridge needle of a dispensing device against the printed circuit board over each hole that is to be provided with a through connection, dispensing a solderable conductive paste through the cartridge needle into each hole such that a protruding, outwardly spreading plug of conductive paste is formed at the back of the hole, and thereafter removing the cartridge needle; and placing a vacuum probe of the dispensing means against the printed circuit board in the area of each hole into which conductive paste has been dispensed and partially sucking out the conductive paste such that contact overlaps of conductive paste are formed on both sides of the printed circuit board adjacent the holes and a continuous layer of conductive paste remains on inside walls of the holes leaving the holes with a defined minimum hole diameter.

In accordance with another aspect of the invention, the objects are also achieved by providing an apparatus for creating through-connections in holes in printed circuit boards comprising a supporting device with a supporting frame for a printed circuit board, and a dispensing device with a cartridge needle which can be positioned over the holes and placed against the circuit board in the area of each hole for dispensing a solderable conductive paste into the hole; the dispensing device further comprising a vacuum probe which can subsequently be positioned over the holes and placed against the circuit board in the area of each hole for sucking up excess conductive paste under controlled vacuum.

Due to the fact that a cartridge needle of the dispensing device is placed upon the printed circuit board in the area of each of the holes in which the connections are to be made and solderable conductive paste is injected, that the cartridge needle is removed and a vacuum probe of the dispensing device is placed upon the circuit board in the area of the hole and the conductive paste is partially sucked out, the conductive paste is caused to form connecting marginal overlaps around the bores on both sides of the circuit board, and the conductive paste is distributed on the inner walls of the holes with the establishment of a specific hole diameter. The formation of the marginal overlaps on the backs of the holes is promoted by the fact that the conductive paste forming the pins decompresses after emerging from the hole and thus the plug spreads out beyond the diameter of the holes. Under the influence of the oppositely directed effect of suction that follows, the conductive paste is drawn back into the holes, resulting in a stripping away of conductive paste at the rear opening of the holes and the formation of marginal overlaps. The application of a vacuum also causes the conductive paste to be largely removed from the area of the holes in the circuit board, so that only a relatively thin layer of conductive paste remains adhering to the walls of the holes, the thickness of which can be adjusted by the intensity of the vacuum, i.e., by the time/pressure ratio. Thus, precisely defined diameters of the through-connections are achieved, which later on will permit the insertion and soldering of the terminals of electronic components.

Preferably the cartridge needles and the vacuum probe are associated with a milling and drilling head, and the creation of the through-connection in the holes is performed immediately after the machining of the circuit board. Furthermore, provision is made in a preferred embodiment for the operation and movement of the milling and drilling head to be controlled by a computer, and for the application of vacuum to the cartridge needle and vacuum probe for the creation of the connection, to be controlled by a control apparatus in accord with the momentary position of the milling and drilling head and the programming of the computer. The result is the considerable advantage that the creation of through-connections in circuit boards is very flexible, with the direct employment of electronically captured control data. This eliminates the need for labor-intensive production of screen printing patterns, and the dispensing of the conductive paste is precisely controllable and always immediately adaptable to requirements.

In accordance with the invention, provision is made so that, after the conductive paste has been dispensed into a hole, a light vacuum is applied to the cartridge needle, since this securely prevents any additional conductive paste from issuing from the cartridge needle in an uncontrolled manner.

According to a preferred embodiment of the process, suction is applied to the vacuum probe while it is still approaching the hole in the circuit board, i.e., before it contacts it, so that the effect of the suction commences very gently or gradually. This makes it possible to apply a very thin coating to the holes in the circuit board so as to provide a precisely defined hole diameter.

According to the invention, a solderable conductive paste is used, so that after the through-connection has been made and after the conductive paste has set, the contacts of electronic components can be soldered into the holes.

A preferred apparatus for use in process of the invention comprises a holding means with a holding frame for the printed-circuit board and a dispensing system with a cartridge needle which can be positioned over the holes and set down onto the circuit board. The dispensing system serves to inject the solderable conductive paste into holes. The dispensing system additionally comprises a vacuum probe which can be positioned on the holes after the conductive paste has been injected, and through which the conductive paste is partially vacuumed away again by controlled suction.

In another preferred apparatus according to the invention, the cartridge needle and the vacuum probe of the dispensing system are attached to a cutting and/or drilling tool, e.g. a milling head, for the mechanical treatment of the circuit board, so that the machining of the circuit board and the production of connections through the bores can be performed by a single machine.

Preferably a computer and a controller or control unit are additionally provided. The computer controls the operation and movements of the cutting and/or drilling tool, and the control unit controls the application of air pressure and vacuum to the cartridge needle and the vacuum probe depending on the momentary position of the cutting and/or drilling tool and the instructions programmed into the computer in order to form the through-contacts. This results in the significant advantage that the formation of through-contacts in circuit boards can be carried out in a very flexible manner with direct employment of electronically captured control data. Thus the labor-intensive production of screen printing patterns or templates and underlayment plates. The dispensing of the conductive paste can be precisely controlled and immediately adjusted to match the respective requirements in any given case.

For optimum configuration of the marginal overlaps formed by the conductive paste at the margins of the holes on both sides of the circuit board, it has been found advantageous for the inside diameter of the cartridge needle at its mouth to be at least 0.2 mm larger than the diameter of the holes in the circuit board which are to be provided with through-contacts, so that in this area the marginal overlaps can be formed on the upper side of the circuit board. In accordance with the invention it is additionally envisioned that the inside diameter of the vacuum probe of the dispenser may also be greater than the inside diameter of the cartridge needle.

BRIEF DESCRIPTION OF THE DRAWINGS

The invention will be described in further detail hereinafter with reference to an illustrative preferred embodiment depicted in the accompanying drawings in which.

DETAILED DESCRIPTION OF PREFERRED EMBODIMENTS

Figure 1:
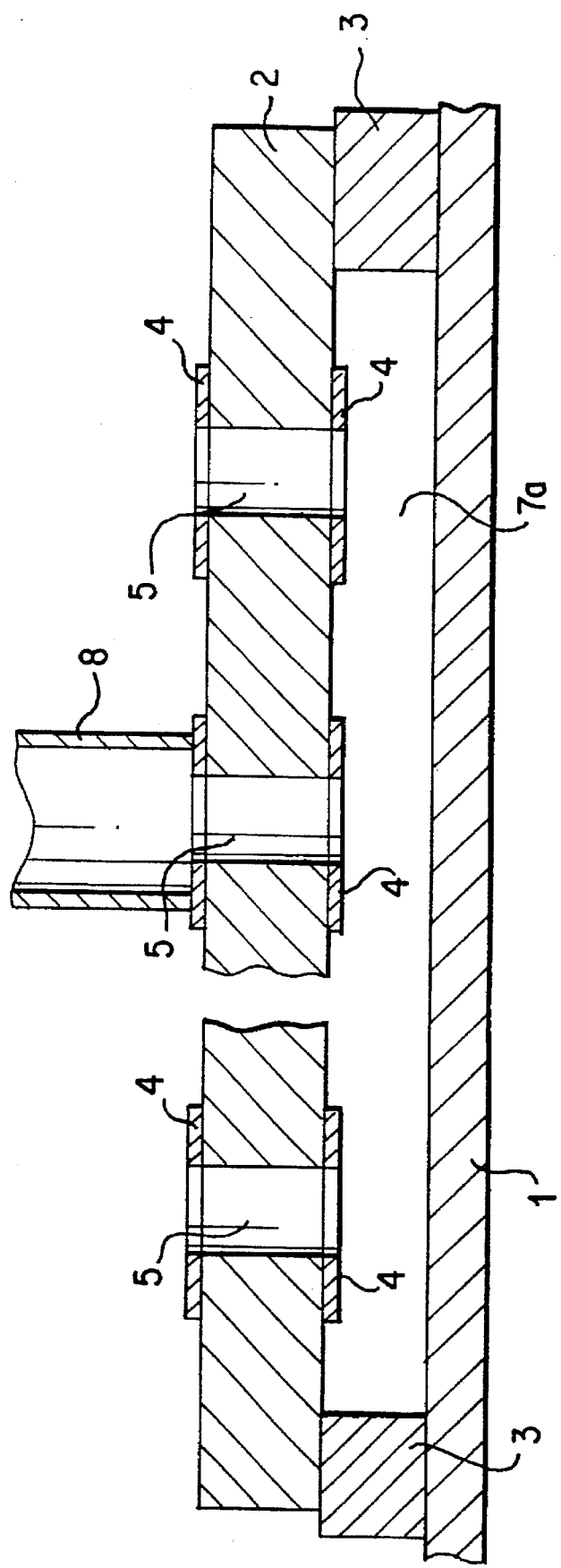
FIG. 1 shows a printed circuit board for the creation of through-connections which is arranged in a holding device provided with a dispenser, prior to the placement of the conductive paste.
Figure 2:
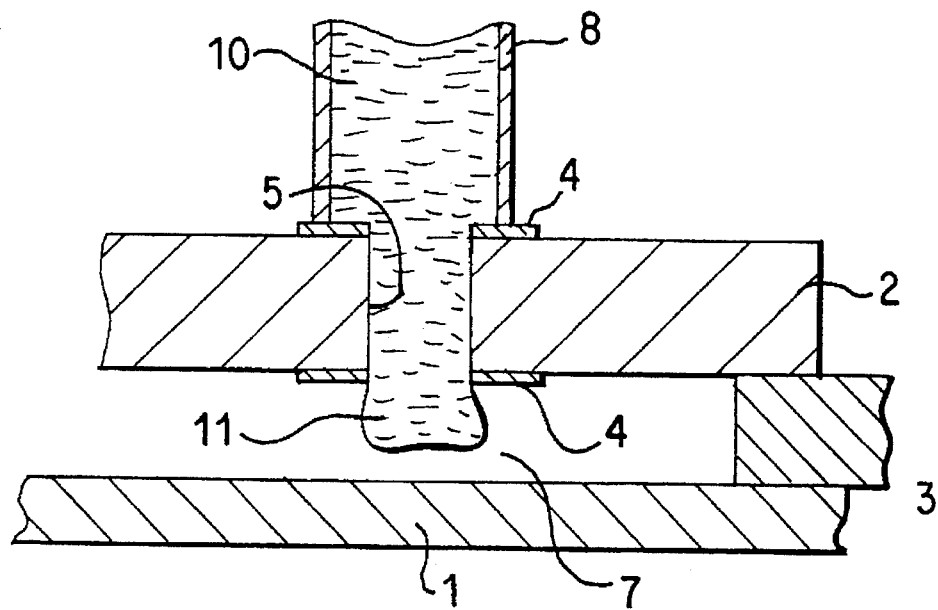
FIG. 2 shows the board of FIG. 1 after placement of the conductive paste.
Figure 3:
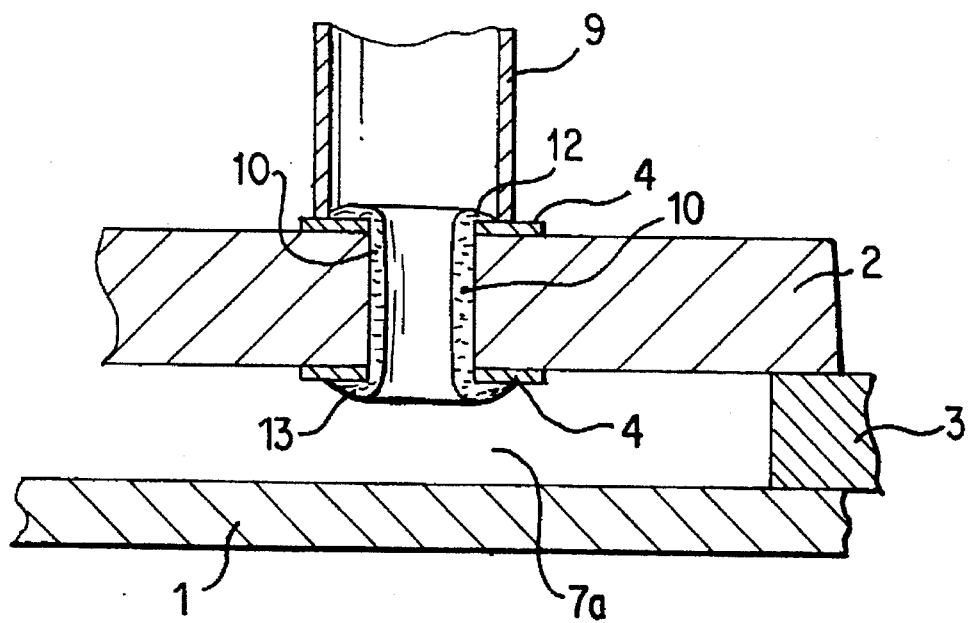
FIG. 3 shows the board of FIG. 1 after the conductive paste has been sucked upward.

In the drawings, the reference numeral 1 identifies a holding device which is configured as a table. A double-sided printed circuit board 2 is placed on the holding device 1 so that through-connections can be created in holes therein. An open supporting frame 3 is between the circuit board 2 and the holding device 3. The supporting frame 3 is made, for example, of hard paper and is about 2 to 3 mm thick. Pads 4, formed by an electrically conductive coating (preferably copper), are provided on both the top and bottom of the circuit board around the holes 5. These pads 4 serve as contact points for conductors and/or electronic components. In FIGS. 1 to 3 of the drawing, only portions of the circuit board 2 are illustrated, the illustrations being greatly enlarged.

Figure 4:
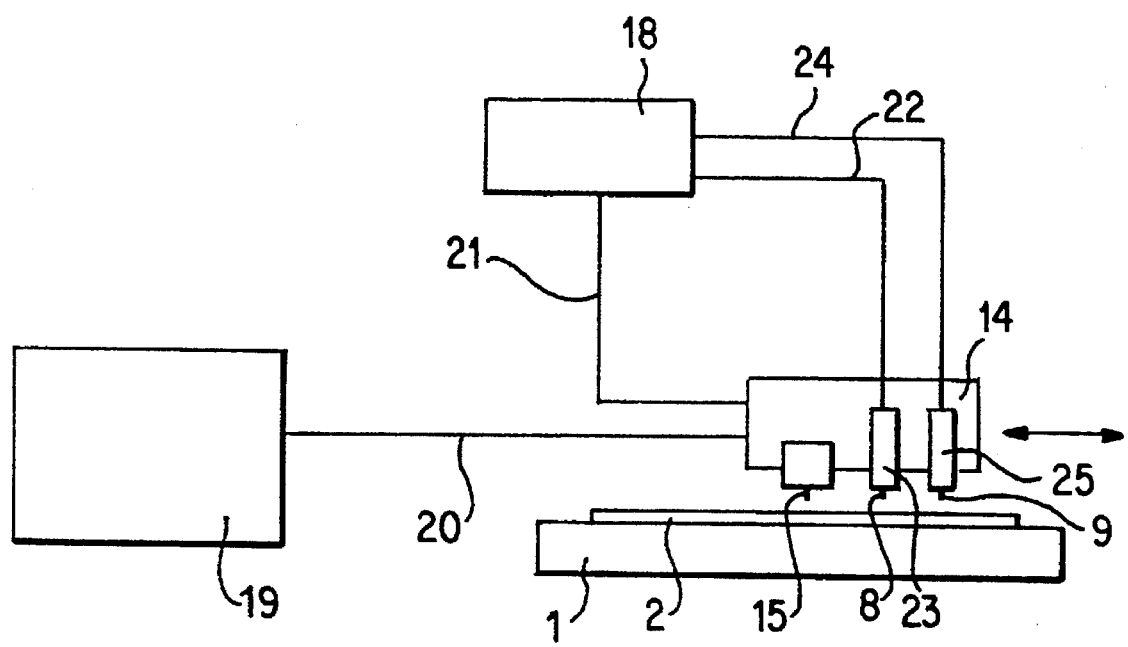
FIG. 4 shows a schematic drawing of the apparatus for creating through-connections.

FIG. 4 of the drawing shows an apparatus with a milling and drilling head 14 movable parallel to the circuit board 2 in order to produce through-connections. The traveling movement of head 14 is controlled by a computer 19 which is connected by control lines 20 to motors which drive the milling and drilling head 14 and which for simplicity of illustration have not been shown in the drawing. The milling and drilling head 14 is connected by lines 21 to a control unit 18 for feeding compressed air and applying a vacuum. From the control unit 18 a line 22 runs to a cartridge 23 disposed on the milling and drilling head 14 with a cartridge needle 8 for injecting conductive paste into the holes 5 in the circuit board 2. A suction line 24 furthermore runs from the control unit 18 to a cartridge 25 with a vacuum probe 9 for drawing excess conductive paste out of the holes 5 of the circuit board 2. The milling and drilling head 14 also includes a drill 15 which can, if desired, be replaced by a burr. The holes 5 are drilled into the circuit board by means of the drill 15, or a pattern is cut in the circuit board (2) by means of the burr.

As can be seen in FIG. 1, the cartridge needle 8 lies sealingly on the top side of the printed-circuit board 2, i.e., against the pad 4 disposed thereon. Prior to that the hole 5 was drilled by the drill 15 in the milling and drilling head 14.

As shown in FIG. 2, a measured amount of solderable conductive paste 10 is dispensed through the cartridge needle 8 into the holes 5 in the circuit board 2 to create the connection through the circuit board. Conductive paste 10 is supplied to the cartridge needle 8 from the cartridge 23, which is shown in FIG. 4. For this purpose compressed air is fed through line 22 to the cartridge 23, the supply of compressed air being controlled by the control unit 18 in accordance with the momentary position of the milling and drilling head 14 and the programming of the computer 19. Upon injection by the cartridge needle 8, the conductive paste 10 issues from the holes 5 on the back of the board 2, forming a plug 11. In the area of the holes 5 in the circuit board, the holding frame 3 is provided with a large-area cavity 7a and is also open at the side, so that the cavity 7a can be at atmospheric pressure.

After the measured injection of the conductive paste 10 into the holes 5 in the circuit board 2, a slight vacuum is applied to the cartridge 23 and the cartridge needle 8 by the control unit 18, so that no more conductive paste can come out. Then, as shown in FIG. 3, the vacuum probe 9 is set down onto the circuit board 2 at each of the holes 5 which are to be provided with through-contacts. By applying a vacuum to the cartridge 25 illustrated in FIG. 4, and thus also to the vacuum probe 9 through the suction line 24, excess conductive paste 10 is sucked up out of hole 5 into the cartridge 25, the air being drawn into the vacuum line 24 in accordance with the momentary position of the milling and drilling head 14 and the programming of computer 19.

Preferably, air is drawn into the vacuum probe 9 while it is still approaching the circuit board 2, i.e., approaching the hole 5, so that the action of the vacuum is very gradual or gentle. It has been found that a thin coating of conductive paste 10 can be formed on the walls of holes 5 in this manner. A full-surface distribution of the conductive paste 10 is achieved with the formation of very precisely defined minimum hole diameters. Moreover, thin marginal overlaps are created at 12 and 13 in connection with the pads 4. The formation of the marginal overlaps 13 on pads 4 on the underside of the circuit board 2 is favored by the fact that the conductive paste 10 forming the plugs 12 decompresses after issuing from holes 5 so that the plugs 11 spread out or thicken beyond the diameters of the holes 5. If then the conductive paste 10 is sucked under good control back into the holes 5, the paste is scraped off on the bottom margins of the holes 5 and makes contact with the pads 4 of the circuit board 2. Finally there remains on the bottom of the circuit board 2 a thin marginal covering 13 in contact with the pads providing a secure electrical connection.

The amount of the paste 10 remaining on the walls of the holes 5 can be controlled by the strength of the vacuum. Thus, well-defined minimum connection hole diameters can be made into which electronic components can later be inserted and soldered. It is to be noted that a conductive paste 10 is used which enables the connections to accept solder. It is known how conventional non-silver containing conductive pastes form a layer on their surface after application which will not accept solder, since the silver diffuses away from the surface into the paste. It is for this reason that no electrically conducting connection can be produced by the tinning performed in the soldering procedure.

As it is apparent from FIG. 3 of the drawing, after the conductive paste 10 has been sucked up, a marginal overlap 12 forms also on the upper side of the circuit board 2 inside of the vacuum probe 9. Here, too, some of the conductive paste applied by the cartridge needle 8 remains on the exposed area of the pad 4 where it produces an electrically secure connection. The diameter of the marginal overlaps 12 remaining on the top side of the circuit board 2 is ultimately determined by the inside diameter of the vacuum probe 9 sealingly resting thereon. This inside diameter is always greater than the inside diameter of the cartridge needle 8.

After the production of a through-connection by means of the conductive paste 10, the paste must be set in an oven at about 160° C. for about 30 minutes. Thereafter the circuit board 2 can be provided as desired with the terminals of electrical components and soldered.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for creating through-connections in holes through multi-layer printed circuit boards comprising the steps of:

placing a circuit board having through holes which are to be provided with a through-connection on a supporting frame which leaves free areas beneath the holes;

placing a cartridge needle of a dispensing device against the printed circuit board over each hole that is to be provided with a through connection, dispensing a solderable conductive paste through the cartridge needle into each hole such that a protruding, outwardly spreading plug of conductive paste is formed at the back of the hole, and thereafter removing the cartridge needle; and placing a vacuum probe of the dispensing means against the printed circuit board in the area of each hole into which conductive paste has been dispensed and partially sucking out the conductive paste such that contact overlaps of conductive paste are formed on both sides of the printed circuit board adjacent the holes and a continuous layer of conductive paste remains on inside walls of the holes leaving the holes with a defined minimum hole diameter.

2. A method according to claim 1, wherein said cartridge needle and said vacuum probe are associated in a single apparatus with a cutting or drilling tool used to form the circuit board, and said method for creating through-connections in the holes is carried out immediately after cutting or drilling to form the circuit board.

3. A method according to claim 2, wherein positioning and operation of said cutting or drilling tool are controlled by a programmed computer, and operations of the cartridge needle and the vacuum probe are controlled by a controller in response to the position of the cutting or drilling tool and the program of the computer.

4. A method according to claim 1, further comprising after conductive paste is dispensed from the cartridge needle into a hole, applying a vacuum to the cartridge needle such that further discharge of conductive paste is prevented.

5. A method according to claim 1, wherein vacuum is applied to the vacuum probe as the probe approaches the hole in the circuit board which is to be provided with a through-connection, thereby assuring gentle application of the vacuum to the conductive paste.

* * * * *